(12) United States Patent
Akiyama et al.

(10) Patent No.: US 8,889,505 B2
(45) Date of Patent: Nov. 18, 2014

(54) METHOD FOR MANUFACTURING SEMICONDUCTOR DEVICE

(71) Applicant: Fujitsu Semiconductor Limited, Yokohama (JP)

(72) Inventors: Shinichi Akiyama, Yokohama (JP); Kazuya Okubo, Yokohama (JP); Nobuyuki Ohtsuka, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/017,367

(22) Filed: Sep. 4, 2013

(65) Prior Publication Data

US 2014/0004711 A1 Jan. 2, 2014

Related U.S. Application Data

(62) Division of application No. 12/819,708, filed on Jun. 21, 2010, now Pat. No. 8,551,832.

(30) Foreign Application Priority Data

Jun. 24, 2009 (JP) ................. 2009-149314

(51) Int. Cl.
*H01L 21/8238* (2006.01)
*H01L 21/02* (2006.01)

(52) U.S. Cl.
CPC .... *H01L 21/02109* (2013.01); *H01L 21/02178* (2013.01); *H01L 21/02181* (2013.01); *H01L*

(Continued)

(58) Field of Classification Search
CPC . H01L 21/31; H01L 21/311; H01L 21/02107; H01L 21/02329; H01L 21/0234; H01L 21/823807; H01L 21/823857; H01L 29/1054; H01L 29/517; H01L 21/02178; H01L 21/02181; H01L 21/02192; H01L 21/0219; H01L 21/022; H01L 21/02321; H01L 21/02194; H01L 29/4966; H01L 29/513
USPC .......... 438/142, 197, 199, 287; 257/E27.064, 257/E21.632, E27.067
See application file for complete search history.

(56) References Cited

U.S. PATENT DOCUMENTS 6,897,095 B1 5/2005 Adetutu et al.
2005/0098839 A1* 5/2005 Lee et al. ............. 257/410

(Continued)

FOREIGN PATENT DOCUMENTS

JP 2007-537595 A 12/2007
JP 2008-166713 A 7/2008
WO 2005/114718 A1 12/2005

OTHER PUBLICATIONS

T. Morooka et al., "Vt Variation Suppressed Al2O3-Capped HfO2 Gate Dielectrics for Low Vt pMISFETs with High-k/Metal Gate Stacks", Extended Abstracts of the 2008 International Conference on Solid State Devices and Materials, Sep. 23, 2008, pp. 24-25, Tsukuba.

(Continued)

*Primary Examiner* — Khiem D Nguyen
(74) *Attorney, Agent, or Firm* — Westerman, Hattori, Daniels & Adrian, LLP

(57) ABSTRACT

A method for manufacturing a semiconductor device includes forming a first-conductivity-type well and a second-conductivity-type well in a silicon substrate; stacking a first high-dielectric-constant insulating film and a first cap dielectric film above the silicon substrate; removing at least the first cap dielectric film from above the second-conductivity-type well; conducting a first annealing at a first temperature to cause an element included in the first cap dielectric film to diffuse into the first high-dielectric-constant insulating film disposed above the first-conductivity-type well; after the first annealing, stacking a second high-dielectric-constant insulating film and a second cap dielectric film above the silicon substrate; removing the second cap dielectric film disposed above the first-conductivity-type well; and conducting a second annealing at a second temperature lower than the first temperature to cause an element included in the second cap dielectric film to diffuse into the second high-dielectric-constant insulating film disposed above the second-conductivity-type well.

2 Claims, 10 Drawing Sheets

(52) U.S. Cl.
CPC .............. 21/02192 (2013.01); *H01L 21/02194* (2013.01); *H01L 21/022* (2013.01); *H01L 21/02321* (2013.01); *H01L 21/823857* (2013.01)
USPC .......................................... 438/199; 438/287

(56) References Cited

U.S. PATENT DOCUMENTS

| | | | |
|---|---|---|---|
| 2007/0023842 A1* | 2/2007 | Jung et al. | 257/369 |
| 2008/0096383 A1 | 4/2008 | Tigelaar et al. | |
| 2008/0299754 A1* | 12/2008 | Yu et al. | 438/592 |
| 2009/0263961 A1 | 10/2009 | Kher | |
| 2010/0197128 A1* | 8/2010 | Schaeffer et al. | 438/591 |

OTHER PUBLICATIONS

T.W. Hickmott, "Dipole Layers at the Metal-SiO2 Interface", Journal of Applied Physics, Feb. 19, 1980, pp. 4269-4281, vol. 51(8).

* cited by examiner

METHOD FOR MANUFACTURING SEMICONDUCTOR DEVICE

CROSS-REFERENCE TO RELATED APPLICATIONS

This application is a divisional of U.S. application Ser. No. 12/819,708 filed on Jun. 21, 2010, now issued as U.S. Pat. No. 8,551,832, based upon and claims the benefit of priority from the prior Japanese Patent Application No. 2009-149314 filed on Jun. 24, 2009, the entire contents of which are incorporated herein by reference.

FIELD

The present invention relates to a method for manufacturing a complementary metal-oxide-semiconductor (CMOS) device.

BACKGROUND

A metal oxide semiconductor (MOS) transistor typically has a structure in which a gate insulating film made of silicon oxide is formed on a silicon substrate, and a gate electrode made of polysilicon is formed on the gate insulating film and is used as an insulated gate electrode. Impurity ion implantation for forming source/drain regions is also conducted on the polysilicon gate electrode, and thereby a basic threshold adjustment is conducted.

In order to increase the degree of integration of semiconductor integrated circuit devices and to increase the speed thereof, size reduction of metal oxide semiconductor transistors has been achieved in accordance with a scaling law. When the thickness of the silicon oxide gate insulating film is reduced to about 2 nm or less, a direct tunneling current flowing between the gate electrode and the silicon substrate increases, thereby considerably increasing the gate leakage current. Even when the material of the gate insulating film is changed, the direct tunneling current increases as the thickness of the gate insulating film decreases to a certain value or less.

To address the problem of an increase in the gate leakage current, a configuration is adopted in which a high-dielectric-constant insulating material having a higher dielectric constant than the dielectric constant of silicon oxide is used as a gate insulating film, and the physical thickness of the gate insulating film is increased while reducing the equivalent oxide thickness (EOT). When a high-dielectric-constant insulating material having a dielectric constant k times larger than the dielectric constant of silicon oxide is used, the EOT does not change even when the film thickness of the insulating material is increased by k times, thus maintaining controllability of the gate electrode. In order to maintain a surface of a silicon substrate in good condition, a high-dielectric-constant insulating film is usually deposited on a thermally oxidized silicon oxide film having a small thickness.

An oxide including hafnium (Hf), for example, HfO or HfSiO, is typically used as such a high-dielectric-constant insulating material. Note that although the stoichiometric composition of hafnium oxide is $HfO_2$, hafnium oxide is denoted by HfO because the composition may be changed either intentionally or by controlling a production process. Hafnium oxides including HfSiO, HfSiON etc. in which silicon (Si) is added to HfO are denoted by HfO. Other compounds are also represented by similar notation. For example, aluminum oxide (stoichiometric composition: $Al_2O_3$) is denoted by AlO and lanthanum oxide (stoichiometric composition: $La_2O_3$) is denoted by LaO.

Such a polysilicon gate electrode is doped with an impurity to have an n-type conductivity or a p-type conductivity, and a reverse-bias gate voltage is applied to the gate electrode. For example, the gate electrode of an n-channel metal-oxide semiconductor (NMOS) transistor is made of n-type polysilicon, and an ON-voltage of the positive polarity is applied to the gate electrode. In a diode structure including an n-type polysilicon gate electrode, a gate insulating film, and a p-type channel region of a silicon substrate, by applying a reverse-bias voltage, a depletion layer is formed on an interface side of the gate electrode, the interface being disposed between the gate electrode and the gate insulating film. The depletion layer functions as in the gate insulating film to decrease the capacitance of the gate electrode, resulting in a decrease in controllability by the gate voltage.

In addition, the resistivity of polysilicon is not sufficiently low. When the cross-sectional area of the gate electrode is reduced with size reduction of transistors, the resistance of polysilicon is not negligible. Furthermore, in general, electrical conductivity is imparted to a polysilicon gate electrode by ion-implanting an impurity. However, when the ion-implanted impurity passes through a gate insulating film and enters a channel region, transistor characteristics are degraded.

To suppress these phenomena, research and development has been performed on a configuration in which a gate electrode is formed of a metal instead of polysilicon. A metal gate electrode does not cause depletion of electrons, has a low resistance, and does not need impurity implantation. Note that the term "metal gate electrode" means a gate electrode made of an electrically conductive material that exhibits a metallic electrical conductivity for which the electrical resistance increases with an increase in the temperature, examples of such an electrically conductive material including not only pure metals, but also intermetallic alloys, electrically conductive metal nitrides such as titanium nitride (TiN), electrically conductive metal oxides such as iridium oxide (IrO), and silicides such as nickel silicide (NiSi).

In forming an n-channel metal-oxide semiconductor (NMOS) transistor and a p-channel metal-oxide semiconductor (PMOS) transistor, if gate insulating films made of the same material are formed and metal gate electrodes made of the same material are formed on the corresponding gate insulating film, the function of the basic threshold adjustment achieved by polysilicon gate electrodes is lost. In order to adjust the threshold, it is preferable to change at least one of the material of the metal gate electrodes and the material of the gate insulating films in the NMOS transistor and the PMOS transistor. In order to simplify the production process, steps of producing the NMOS transistor and steps of producing the PMOS transistor are preferably shared as much as possible. It is known that the threshold may be adjusted by selectively forming a cap layer on a high-dielectric-constant insulating film serving as a gate insulating film. More specifically, a cap layer made of LaO or the like is formed for an NMOS transistor and a cap layer made of AlO or the like is formed for a PMOS transistor, and lanthanum (La) or aluminum (Al) then diffuses into the corresponding high-dielectric-constant insulating film, whereby the threshold is adjusted.

Japanese National Publication of International Patent Application (Translation of PCT Application) No. 2007-537595 proposes a configuration in which a first gate dielectric material and a second gate dielectric material have different compositions, and a first gate electrode provided on the first gate dielectric material and a second gate electrode provided on the second gate dielectric material have the same composition and the same film thickness. For example, a gate dielectric material of an NMOS transistor is made up of a laminate including a hafnium oxide layer and a lanthanum oxide layer provided on the hafnium oxide layer, and a gate dielectric material of a PMOS transistor is made up of a single hafnium oxide layer or a laminate including a hafnium oxide layer and an aluminum oxide layer provided on the hafnium oxide layer. Gate electrodes made of tantalum carbide (TaC) or tantalum silicon nitride (TaSiN) are stacked on each of the gate dielectric materials, and an electrically conductive layer made of polysilicon or tungsten (W) is stacked on each of the gate electrodes.

According to a report made by Morooka et al.: Extended Abstracts of the 2008 International Conference on Solid State Devices and Materials, pp. 24-25, 2008, in a structure in which an $Al_2O_3$ cap layer is formed on a $HfO_2$ film, when a low-temperature annealing is performed prior to the deposition of the $Al_2O_3$ cap layer and a high-temperature annealing is performed at, for example, about 1,050° C. after the deposition of the $Al_2O_3$ cap layer, an increase in the equivalent oxide thickness is suppressed without causing a threshold shift.

Hickmott: J. Appl. Phys. 51(8) pp. 4269-4281, 1980, describes that, by conducting annealing, a dipole layer disposed at an interface between a metal film and an insulating film contributes to the adjustment of the barrier height, the work function, and the like.

International Laid-open Patent Publication No. 2008-166713 proposes a method of forming cap layers on a high-dielectric-constant insulating film, the cap layers being made of different materials. In this method, a sacrificial film is selectively formed, a first cap layer is formed on the high-dielectric-constant insulating film in regions in which the sacrificial film is not provided, the sacrificial film and the first cap layer provided thereon are removed, and a second cap layer is then formed on the exposed high-dielectric-constant insulating film.

SUMMARY

According to aspects of embodiments, a method for manufacturing a semiconductor device includes forming a first-conductivity-type well of a first conductivity type and a second-conductivity-type well of a conductivity type opposite to the first conductivity type in a silicon substrate; stacking a first high-dielectric-constant insulating film and a first cap dielectric film above the silicon substrate; removing at least the first cap dielectric film from above the second-conductivity-type well; conducting a first annealing at a first temperature to cause an element included in the first cap dielectric film to diffuse into the first high-dielectric-constant insulating film disposed above the first-conductivity-type well; after the first annealing, stacking a second high-dielectric-constant insulating film and a second cap dielectric film above the silicon substrate; removing the second cap dielectric film disposed above the first-conductivity-type well; and conducting a second annealing at a second temperature lower than the first temperature to cause an element included in the second cap dielectric film to diffuse into the second high-dielectric-constant insulating film disposed above the second-conductivity-type well.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments will be explained with reference to accompanying drawings.

Figure 1A:
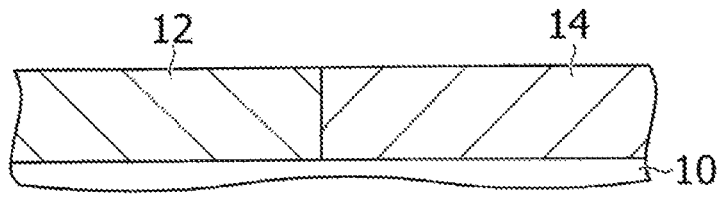
FIGS. 1A to 1U are cross-sectional views illustrating main steps of a method for manufacturing a semiconductor device according to a first embodiment and modifications.
Figure 1B:
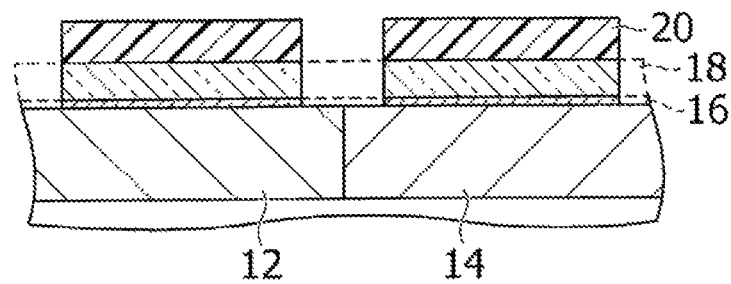
Figure 1C:
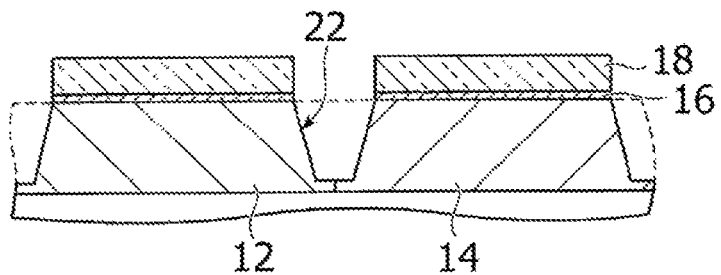
Figure 1D:
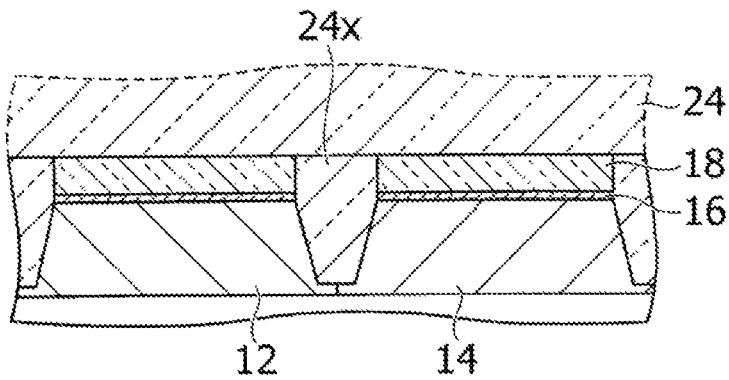
Figure 1E:
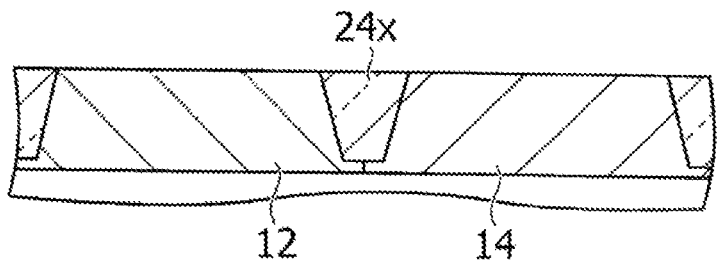
Figure 1F:
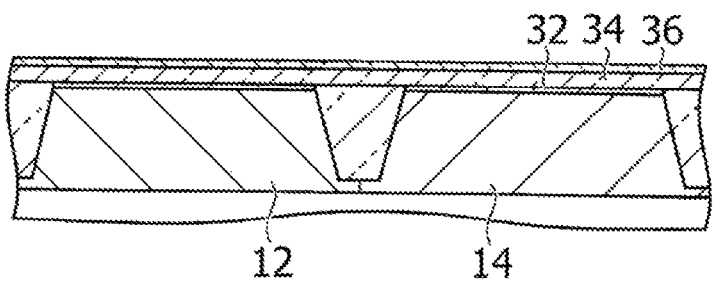
Figure 1G:
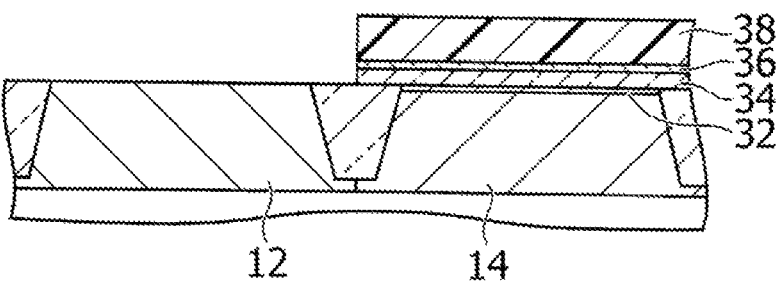
Figure 1H:
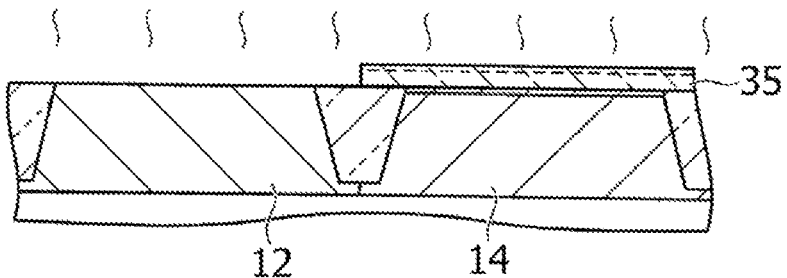
Figure 1I:
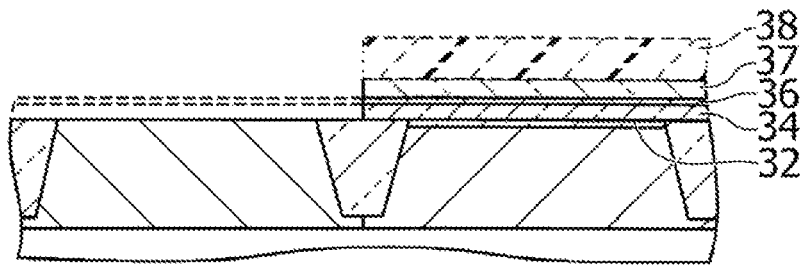
Figure 1J:
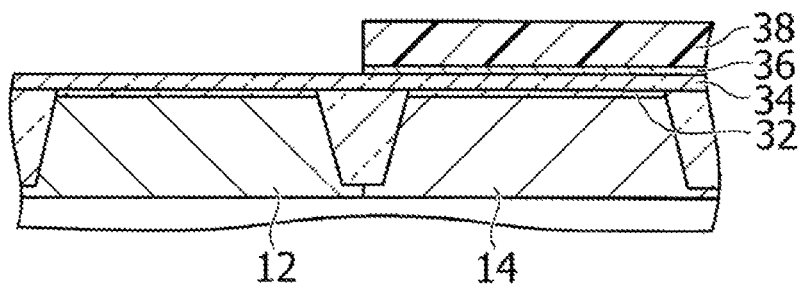
Figure 1K:
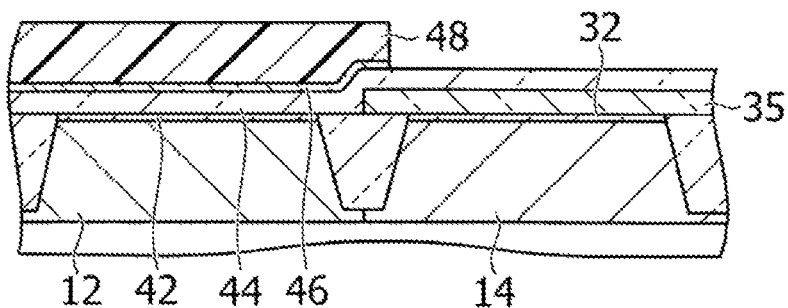
Figure 1L:
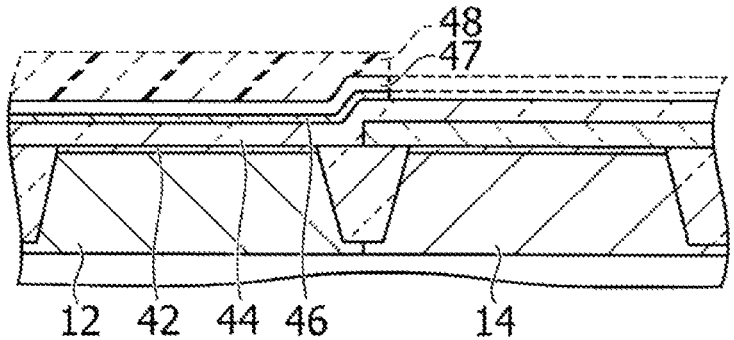
Figure 1M:
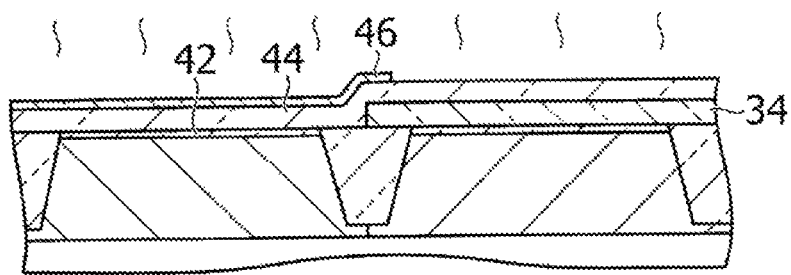
Figure 1N:
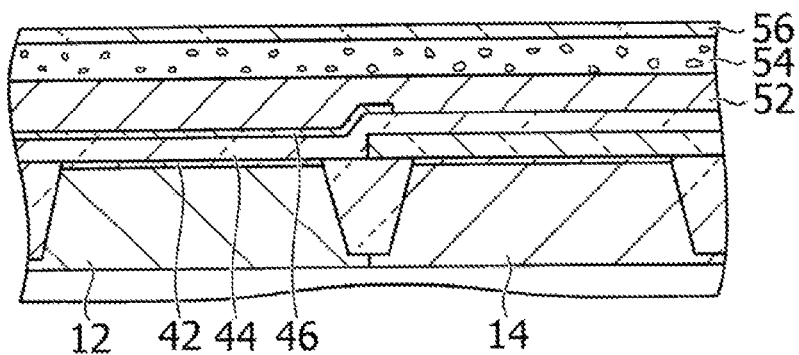
Figure 1O:
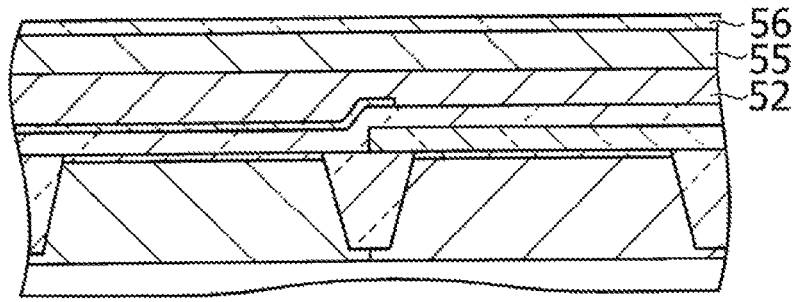
Figure 1P:
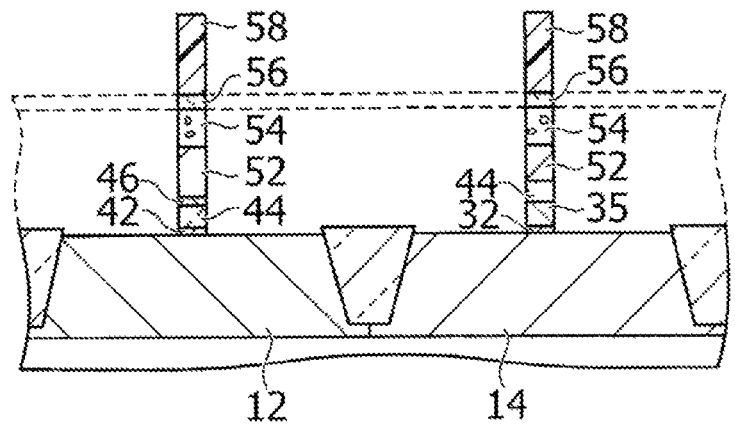
Figure 1Q:
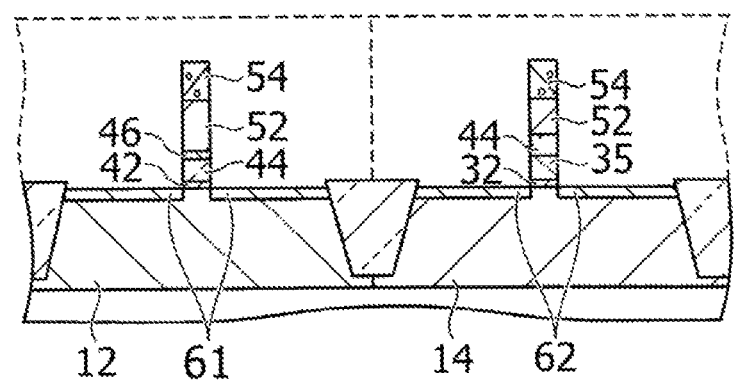
Figure 1R:
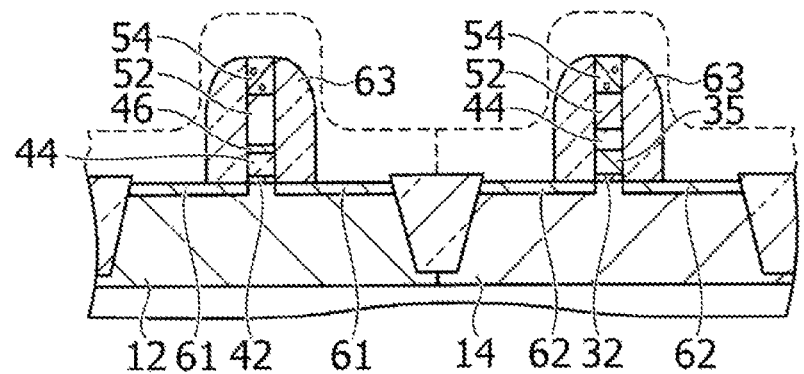
Figure 1S:
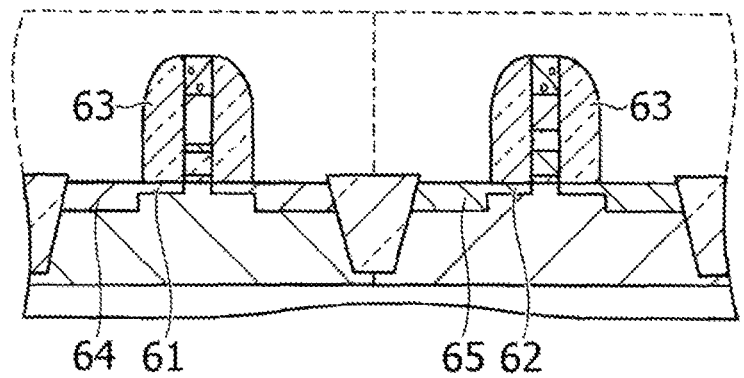
Figure 1T:
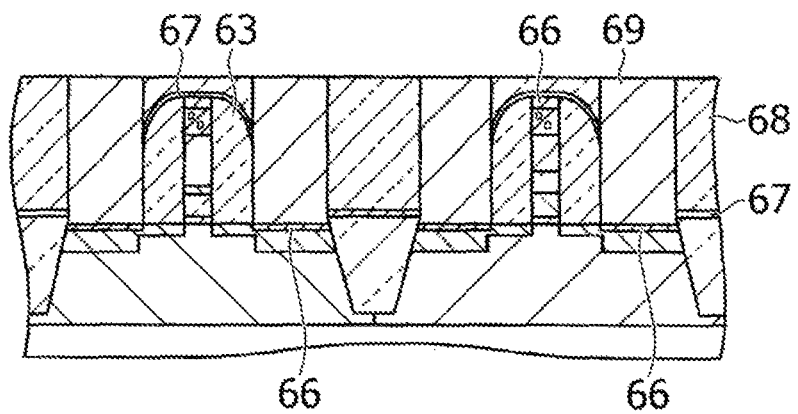
Figure 1U:
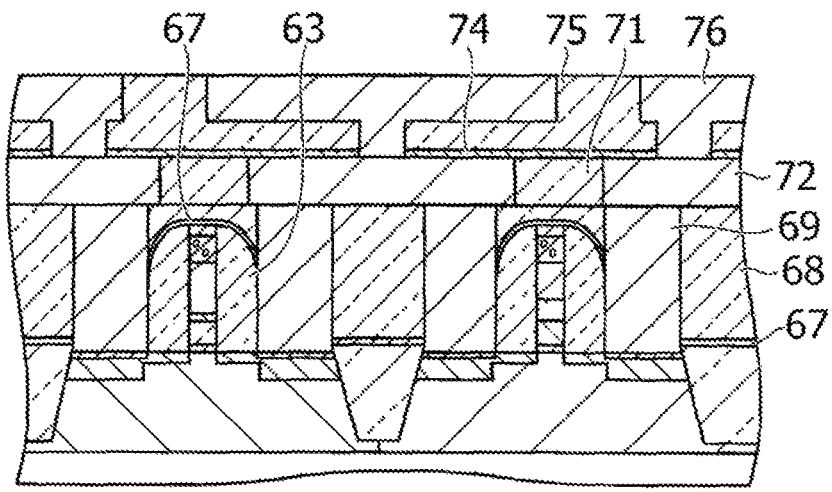

FIGS. 1A to 1U are cross-sectional views illustrating main steps of a method for manufacturing a semiconductor device according to a first embodiment and modifications of the present invention.

As illustrated in FIG. 1A, a p-type well 12 and an n-type well 14 are formed on a silicon substrate 10 having a plane orientation of (100) by ion implantation using a resist pattern as a mask. For example, the p-type well 12 is formed by ion-implanting boron ($B^+$) ions at an acceleration energy of about 120 keV and a dosage of about $1 \times 10^{13}$ $cm^{-2}$, and the n-type well 14 is formed by ion-implanting phosphorus ($P^+$) ions at an acceleration energy of about 300 keV and a dosage of about $1 \times 10^{13}$ $cm^{-2}$.

As illustrated in FIG. 1B, the surface of the silicon substrate 10 is thermally oxidized to form a silicon oxide film 16, and a silicon nitride film 18 having a thickness of, for example, about 50 nm is formed on the silicon oxide film 16 by chemical vapor deposition (CVD). The silicon oxide film 16 is a buffer oxide film that protects the surface of the silicon substrate 10. The silicon nitride film 18 is a film functioning as a hard mask in trench etching and as a stopper in chemical mechanical polishing (CMP). A resist film is applied onto the silicon nitride film 18 to form a resist pattern 20 having an opening on an element isolation region. The silicon nitride film 18 is etched using the resist pattern 20 as an etching mask to form a hard mask. The silicon oxide film 16 may also be etched. For example, this etching is conducted by, for example, reactive ion etching (RIE) using tetrafluoromethane ($CF_4$), trifluoromethane ($CHF_3$), argon (Ar), oxygen ($O_2$), or the like. The resist pattern 20 is then removed by a resist remover, ashing, or the like.

As illustrated in FIG. 1C, a trench 22 having a depth of about 400 nm is etched in the silicon substrate 10 using the hard mask of the silicon nitride film 18 as an etching mask. This etching is performed by, for example, RIE using hydrogen bromide (HBr), chlorine ($Cl_2$), oxygen ($O_2$), nitrogen ($N_2$), or the like.

As illustrated in FIG. 1D, the surface of the trench 22 is thermally oxidized as needed, and a silicon oxide film 24 having a thickness of about 600 nm is deposited by high-density plasma-enhanced chemical vapor deposition (HD-PECVD) so as to embed the trench 22. The trench 22 is embedded with the silicon oxide film 24 to form a shallow trench isolation (STI) 24x. Subsequently, CMP is conducted using the silicon nitride film 18 as a stopper to remove the silicon oxide film 24 disposed on the silicon nitride film 18.

As illustrated in FIG. 1E, the silicon nitride film 18 and the silicon oxide film 16 are removed. For example, the silicon nitride film 18 is wet-etched with hot phosphoric acid, and the silicon oxide film 16 is wet-etched with diluted hydrofluoric acid. The p-type well 12 and the n-type well 14 are exposed to the surface. A step of removing a silicon oxide film is repeatedly conducted in subsequent steps. Although the surface of the STI 24x and the surface of the silicon substrate 10 form irregularities, for simplification of the drawing, the surface is illustrated as a substantially flat surface. In this stage, ion implantation for a channel dose is conducted. For example, boron ($B^+$) ions are ion-implanted into the p-type well 12 at an acceleration energy of about 15 keV and a dosage of about $1 \times 10^{13}$ $cm^{-2}$, and arsenic ($As^+$) ions are ion-implanted into the n-type well 14 at an acceleration energy of about 80 keV and a dosage of about $1 \times 10^{13}$ $cm^{-2}$. Note that the ion implantation for forming the wells illustrated in FIG. 1A may be conducted in the state illustrated in FIG. 1E.

As illustrated in FIG. 1F, a silicon oxide (SiO) film 32 having a thickness in the range of 0.5 to 1.0 nm is formed on the surfaces of the n-type well 14 and the p-type well 12 by thermal oxidation in an oxidizing atmosphere such as oxygen, ozone, an oxidizing and nitriding gas, or the like. For example, a silicon oxide film 32 having a thickness of about 0.7 nm is formed.

The silicon oxide film 32 may be treated with nitrogen ($N_2$) plasma and then annealed at a temperature in the range of 750° C. to 1,100° C., thus performing a nitriding treatment. Herein, when silicon oxide is subjected to a nitriding treatment to produce silicon oxynitride (SiON), the resulting product is also referred to as "silicon oxide".

A first high-dielectric-constant insulating film 34 is stacked on the silicon oxide film 32, and a first cap dielectric film 36 functioning as a diffusion source for the first high-dielectric-constant insulating film 34 is stacked on the first high-dielectric-constant insulating film 34. For example, a hafnium oxide (HfO) film 34 having a thickness in the range of 0.5 to 1.5 nm, e.g., about 1.0 nm and an aluminum oxide (AlO) film 36 having a thickness in the range of 0.3 to 1.0 nm, e.g., about 0.5 nm are deposited by, for example, thermal chemical vapor deposition (CVD), atomic layer deposition (ALD), or physical vapor deposition (PVD). For example, the HfO film is deposited by an ALD method at a deposition temperature in the range of 100° C. to 400° C. using hafnium tetrachloride ($HfCl_4$) as a material source and using an oxidizing agent such as water ($H_2O$), heavy water ($D_2O$), ozone ($O_3$), or oxygen ($O_2$). Alternatively, for example, in forming a film made of hafnium silicon oxide (HfSiO), hafnium silicon oxynitride (HfSiON), or the like in which silicon (Si) is added to hafnium oxide (HfO), the film is formed by a CVD method (at a deposition temperature in the range of 300° C. to 700° C.) or an ALD method (at a deposition temperature in the range of 100° C. to 400° C.) using, as a hafnium source, for example, tetrakis(dimethylamino)hafnium (TDMAHf), tetrakis(diethylamino)hafnium (TDEAHf), tetra ethyl methyl amino hafnium (TEMAHf), or tetra-tert-butoxy hafnium (Hf (t-$OC_4H_9$)$_4$) and, as a silicon source, for example, monosilane ($SiH_4$), disilane ($Si_2H_6$), tetrakis(ethylmethylamino)silane (Si(NEtMe)$_4$), tetrakis(dimethylamino)silane (Si(NMe$_2$)$_4$), tris(dimethylamino)silane (SiH(NMe$_2$)$_3$), tributoxysilanol (SiOH(t-BuO)$_3$), tetraethoxysilane (TEOS), or dimethylsilane (DMS) together with the oxidizing agent described above.

Nitriding may be performed by a heat treatment in a nitriding gas atmosphere or irradiation of plasma including nitrogen. When nitriding is performed by a heat treatment in a nitriding gas atmosphere, a heat treatment is performed in an atmosphere of a nitrogen-including nitriding gas (e.g., ammonia gas, nitrogen monoxide gas, dinitrogen monoxide gas, or nitrogen dioxide gas), the flow rate of which is controlled so that the pressure is in the range of 0.1 to 760 Torr at a temperature in the range of 500° C. to 1,000° C. for 1 to 600 seconds. When nitriding is performed by irradiation of a plasma including nitrogen, for example, nitrogen plasma, ammonia plasma, nitrogen monoxide plasma, or a plasma including nitrogen is used, and an electric power is selected in the range of 50 to 2,000 W, and the gas pressure is selected in the range of 1 m Torr to 1 Torr. In either case, nitriding is performed under conditions that prevent a significant increase in the nitrogen concentration of the interface between the silicon oxide film and the silicon substrate due to diffusion of nitrogen into the interface.

The AlO film may be formed, for example, by sputtering an aluminum (Al) target or an aluminum oxide (AlO) target at a substrate temperature in the range of −30° C. to 400° C., an RF power in the range of 0 to 2,000 W, and a DC power in the range of 0 to 50,000 W using argon (Ar) gas by a PVD method. When an aluminum target is used, an aluminum film is deposited. However, the aluminum film may then be naturally oxidized or exposed to a gas atmosphere including oxygen to obtain the AlO film. Alternatively, the AlO film may be deposited by an ALD method using, for example, trimethylaluminum (TMA) or the like as a material source and, for example, an oxidizing agent such as water ($H_2O$), heavy water ($D_2O$), ozone ($O_3$), or oxygen ($O_2$) at a deposition temperature in the range of 100° C. to 400° C.

At least one element selected from zirconium (Zr), titanium (Ti), aluminum (Al), silicon (Si), tantalum (Ta), lanthanum (La), yttrium (Y), and magnesium (Mg) may be added to the HfO film within the range in which the threshold of a PMOS transistor is controlled. Here, the reason why aluminum is added to HfO in advance is that an effect of stabilizing whole HfO is expected. On the other hand, since the Al-added HfO remains on the NMOS side, it is difficult to add aluminum to the PMOS transistor in a sufficient amount. Therefore, an AlO film is deposited on a HfO film, and a step of removing the AlO film deposited on the NMOS side is performed.

A gate insulating film having a total thickness of about 2.2 nm is formed; however, this thickness is insufficient to suppress the gate leakage current. The AlO film 36 is a layer that causes aluminum to diffuse into the HfO film 34 to adjust the threshold of the PMOS transistor, and is unnecessary for the NMOS transistor. Alternatively, a titanium oxide (TiO) film or a tantalum oxide (TaO) film may be used instead of the AlO film.

As illustrated in FIG. 1G, a resist film is applied onto the AlO film 36 and then patterned by exposure and development to form a resist pattern 38 covering the PMOS transistor and having an opening at a position corresponding to the NMOS transistor. At least the AlO film 36 located on the p-type well 12 which is an NMOS transistor region is removed by etching using the resist pattern 38 as an etching mask. FIG. 1G illustrates a state in which all the AlO film 36, the HfO film 34, and the SiO film 32 are removed. When not only the AlO film 36 but also the HfO film 34 and the SiO film 32 are etched, a treatment with diluted hydrofluoric acid may be performed. The resist pattern 38 is then removed.

FIG. 1J illustrates the case where only the AlO film 36 is removed. When the HfO film provided under the AlO film is an $HfO_2$ film and is subjected to a heat treatment at about 600° C. or higher, the HfO film may not be dissolved in hydrofluoric acid. As illustrated in FIG. 1J, only the AlO film 36 may be removed to leave the HfO film 34. Alternatively, when etching is performed using, for example, diluted tetramethylammonium hydroxide (TMAH) instead of diluted hydrofluoric acid, the HfO film is similarly left as illustrated in FIG. 1J. Alternatively, wet etching optimized for each type of film may be performed under selected conditions of temperature, concentration, and time of treatment with an alkali solution or an acid solution. The resist pattern 38 is then removed.

As illustrated in FIG. 1H, a high-temperature annealing is performed, for example, at a temperature in the range of 750° C. to 1,100° C. for about five seconds. This annealing causes aluminum to diffuse from the AlO film 36 into the HfO film 34. In order to cause aluminum to diffuse from the AlO film 36, annealing at a relatively high temperature is preferably conducted. For example, annealing is conducted in nitrogen ($N_2$) atmosphere at about 1,050° C. for about five seconds. It is believed that aluminum thermally diffuses from the AlO film 36 and diffuses to the interface between the HfO film 34 and the SiO film 32. It is preferable that aluminum does not diffuse to the n-type well 14 (channel region). The HfO film 34 and the AlO film 36 are fused to each other by the high-temperature annealing to form an Al-diffused HfO (HfO:Al) film 35. A hard mask may be used in etching the laminate.

As illustrated in FIG. 1I, a hard mask layer 37 is formed on the AlO film 36, and a resist mask 38 may then be formed thereon. The hard mask layer 37 may be formed of a metal layer such as a titanium (Ti) layer; a metal nitride layer such as titanium nitride (TiN) layer; or a dielectric layer such as a silicon oxide layer or a silicon nitride layer. For example, a TiN film is formed on the AlO film 36, and a SiN film is deposited thereon at about 450° C. to form the hard mask layer 37 having a two-layer structure. The SiN film of the hard mask layer 37 in an NMOS region is removed by dry etching or fluorine etching using the resist mask 38 as an etching mask, and the resist mask 38 is then removed. Next, the TiN film in the NMOS region is wet-etched with, for example, hydrogen peroxide ($H_2O_2$) using the SiN film of the hard mask layer 37 in a PMOS region. Subsequently, the AlO film 36 appearing in the NMOS region is removed by etching with hydrofluoric acid. In this case, from the top, the SiN film and the TiN film may form a mask in the PMOS region. The SiN film is removed by this treatment with hydrofluoric acid, and the TiN film remains.

In the NMOS region, the AlO film 36 is removed with hydrofluoric acid, and the HfO film 34 and the silicon oxide film 32 disposed thereunder may also be removed at the same time. However, if the HfO film 34 is subjected to a heat treatment at about 600° C. or higher, the HfO film 34 may not be dissolved in hydrofluoric acid. Whether or not the HfO film 34 will be left as illustrated in FIG. 1J is determined by whether or not the heat treatment is performed. The TiN film remaining in the PMOS region is then wet-etched with, for example, a $H_2O_2$ solution.

In the modifications illustrated in FIGS. 1I and 1J, similarly, the resist mask 38 is removed, and the annealing illustrated in FIG. 1H is then conducted in a state in which the surface of the AlO film 36 is exposed.

As illustrated in FIG. 1K, when the gate insulating film disposed on the NMOS transistor region is removed, after the step illustrated in FIG. 1H, a thermally oxidized film (silicon oxide film) 42 having a thickness in the range of 0.5 to 1.0 nm, for example, having a thickness of about 0.7 nm is formed on the surface of the p-type well 12. A second high-dielectric-constant insulating film 44 and a second cap dielectric film 46 functioning as a diffusion source for the second high-dielectric-constant insulating film 44 are stacked over the substrate so as to cover the silicon oxide (SiO) film 42. For example, a hafnium oxide (HfO) film 44 having a thickness in the range of 0.5 to 2.0 nm, for example, having a thickness of about 1.5 nm and a lanthanum oxide (LaO) film 46 having a thickness in the range of 0.3 to 1.0 nm, for example, having a thickness of about 0.6 nm are deposited by thermal CVD, ALD, PVD, or the like. Instead of the LaO film, for example, a film made of an oxide of other rare earth elements, an yttrium oxide (YO) film, or a magnesium oxide (MgO) film may be used. The LaO film may be obtained by, for example, sputtering a lanthanum (La) target or a lanthanum oxide (LaO) target at a substrate temperature in the range of −30° C. to 400° C., an RF power in the range of 0 to 2,000 W, and a DC power in the range of 0 to 50,000 W using argon (Ar) gas by a PVD method. When a lanthanum target is used, a lanthanum film is deposited. However, the lanthanum film may then be naturally oxidized or exposed to a gas atmosphere including oxygen to obtain the LaO film. Alternatively, the LaO film may be deposited by an ALD method using, for example, $La(thd)_3$ (thd=2,2,6,6-tetramethyl-3,5-heptanedionato=$C_{11}H_{19}O_2$) or the like as a material source and, for example, an oxidizing agent such as water ($H_2O$), heavy water ($D_2O$), ozone ($O_3$), or oxygen ($O_2$) at a deposition temperature in the range of 100° C. to 400° C.

The LaO film 46 is a layer that causes lanthanum to diffuse into the HfO film 44 to adjust the threshold of the NMOS transistor, and is unnecessary for the PMOS transistor. A resist pattern 48 covering the NMOS transistor region and having an opening at a position corresponding to the PMOS transistor region is formed on the LaO film 46, and the LaO 46 exposed to the opening is removed by etching. For example, wet-etching is performed with an acid solution, namely, diluted nitric acid ($HNO_3$) or hydrochloric acid (HCl). The resist pattern 48 is then removed.

In the PMOS transistor region, a gate insulating film including the SiO film 32, the HfO film 35, and the HfO film 44 having a sufficient thickness is formed. In the example described above, the thickness of the gate insulating film of the PMOS transistor region is about 3.7 nm in total. The thickness of the gate insulating film of the NMOS transistor region is about 2.8 nm in total.

In the modification illustrated in FIG. 1J, when the SiO film 32 and the HfO film 34 are left on the p-type well 12, the SiO film 42 is not formed. The HfO film 44 and the LaO film 46 are deposited on the HfO film 34. A hard mask may be used for etching the LaO film.

As illustrated in FIG. 1L, a hard mask layer 47 is formed of the LaO film 46, and the resist pattern 48 may then be formed thereon. The hard mask layer 47 is etched using the resist pattern 48 as an etching mask, and the resist pattern 48 is then removed. Subsequently, the LaO film 46 is etched using the hard mask layer 47 as an etching mask. The hard mask layer 47 is then removed.

As illustrated in FIG. 1M, rapid thermal annealing (RTA) is performed at a temperature in the range of about 500° C. to 1,000° C. for about five seconds in a state in which the LaO film 46 is left above the p-type well 12. For example, annealing is performed at about 850° C. for about five seconds in a nitrogen ($N_2$) atmosphere. It is believed that lanthanum in the LaO film 46 diffuses to the interface between the HfO film 44 and the SiO film 42. However, preferably, the temperature during this annealing is suppressed so that the annealing does not excessively proceed. It has been found that when lanthanum excessively diffuses, the threshold significantly varies, and that when a LaO film and a HfO film are fused to each other, the resulting film is not readily removed by etching.

After annealing for causing aluminum to diffuse from the AlO film 36 to the HfO film 34 is performed in the PMOS transistor region, the LaO film 46 is formed on the HfO film 44 in the NMOS transistor region, and annealing for causing lanthanum to diffuse is performed. Thus, a sufficiently strong annealing condition may be set for the diffusion of aluminum while suppressing the annealing condition for the diffusion of lanthanum. When diffusion of lanthanum is similarly achieved by another annealing step performed later in the process, the annealing for causing lanthanum to diffuse may be replaced with the other annealing.

As illustrated in FIG. 1N, a titanium nitride (TiN) film 52 serving as metal gate electrodes and having a thickness of about 10 nm is deposited on the LaO film 46 and the exposed HfO film 44 by sputtering. For example, the TiN film 52 is deposited using a TiN target at a substrate temperature in the range of −30° C. to 400° C., an RF power in the range of 0 to 2,000 W, and a DC power in the range of 0 to 50,000 W by sputtering in a nitrogen ($N_2$) or (argon (Ar)+nitrogen ($N_2$)) gas atmosphere. In the PVD method, both an RF power and a DC power may be applied. The sum of the RF power and the DC power is the effective electric power applied. When one of the electric powers is zero, the other electric power is not zero. Alternatively, the TiN film 52 may be deposited by ALD or CVD. The TiN film 52 is made of nitrogen (N)-rich (poison) TiN, which is suitable for the PMOS transistor. Note that this structure of the gate electrode is an example, and the structure of the gate electrode is not limited thereto. The metal gate electrode may be a single layer made of titanium (Ti), hafnium (Hf), aluminum (Al), tungsten (W), iridium (Ir), molybdenum (Mo), ruthenium (Ru), platinum (Pt), nickel (Ni), titanium tantalum (TiTa), ruthenium tantalum (RuTa), tungsten nitride (WN), titanium aluminum nitride (TiAlN), titanium silicon nitride (TiSiN), tantalum silicon nitride (TaSiN), tantalum nitride (TaN), titanium nitride (TiN), zirconium nitride (ZrN), hafnium nitride (HfN), titanium silicide (TiSi), nickel silicide (NiSi), tungsten silicide (WSi), cobalt silicide (CoSi), molybdenum silicide (MoSi), iridium oxide (IrO), ruthenium oxide (RuO), platinum radium (PtRa), tantalum carbide nitride (TaCN), or molybdenum nitride (MoN) or a laminate including layers each made of any of these substances.

A polysilicon film 54 having a thickness in the range of about 10 to 100 nm and a hard mask layer 56 made up of a silicon nitride film and having a thickness, for example, in the range of about 5 to 20 nm are deposited on the TiN film 52 in this order by CVD, PVD, or the like.

As illustrated in FIG. 1O, a tungsten (W) film 55 having a thickness of about 50 nm may be formed instead of the polysilicon film 54.

As illustrated in FIG. 1P, a resist pattern 58 having a shape of the gate electrodes is formed on the hard mask layer 56. The hard mask layer 56 is etched using the resist pattern 58 as an etching mask. The gate electrodes are patterned using the patterned hard mask layer 56 as an etching mask. Subsequently, if the resist pattern 58 remains, the resist pattern 58 is removed and the hard mask layer 56 is removed. Alternatively, the hard mask layer 56, the polysilicon film 54, and the metal film (TiN film) 52 may be etched using the resist pattern 58 as a mask. When the insulating films 44 and 46 are exposed, then the resist pattern 58 may be removed. Next, the insulating films 46, 44, 42, 44, 35, and 32 may be removed using the hard mask layer 56 as a mask, and the hard mask layer 56 may then be removed if the hard mask layer 56 remains.

The insulating gate electrode of the PMOS transistor includes a laminate having, from the top, the polysilicon film 54, the TiN film 52, the HfO film 44, the Al-diffused HfO film 35, and the SiO film 32. The gate insulating film includes a laminate having the HfO film 44, the Al-diffused HfO film 35, and the SiO film 32 and has a structure in which the first HfO film 35 and the second HfO film 44 are stacked. By reducing the thickness of the first HfO film 35, diffusion of aluminum to the interface between HfO and SiO may be easily performed. Furthermore, a HfO film having a small thickness does not tend to crystallize, and thus is advantageous for suppressing the leakage current through grain boundaries. By stacking the second HfO film 44 on the first HfO film 35, the high-dielectric-constant insulating film has a sufficient thickness as a whole, thus suppressing the gate leakage current.

The gate electrode of the NMOS transistor includes a laminate having, from the top, the polysilicon film 54, the TiN film 52, the LaO film 46, the La-diffused HfO film 44, and the SiO film 42. The gate insulating film includes a laminate having the LaO film 46, the La-diffused HfO film 44, and the SiO film 42. The LaO film 46 and the HfO film 44 suppress the effect of the high-temperature annealing for causing aluminum to diffuse.

As illustrated in FIG. 1Q, the PMOS region and the NMOS region are selectively covered with a resist pattern, an n-type impurity is ion-implanted in the NMOS region to form an n-type extension region 61, and a p-type impurity is ion-implanted in the PMOS region to form a p-type extension region 62. For example, arsenic (As$^+$) ions are ion-implanted in the NMOS region at an acceleration energy of about 1 keV and a dosage of about $1\times10^{15}$ cm$^{-2}$, and boron (B$^+$) ions are ion-implanted in the PMOS region at an acceleration energy of about 0.5 keV and a dosage of about $1\times10^{15}$ cm$^{-2}$.

As illustrated in FIG. 1R, a dielectric film made up of a silicon oxide film (or a silicon nitride film) having a thickness of about 100 nm is deposited on the silicon substrate 10 by CVD. Part of the dielectric film located on flat portions is then removed by performing anisotropic etching such as reactive ion etching (RIE) to form sidewall spacers 63 on the sidewalls of the gate electrodes.

As illustrated in FIG. 1S, the PMOS region and the NMOS region are selectively covered with a resist pattern, an n-type impurity is ion-implanted in the NMOS region to form an n-type low-resistance region 64, and a p-type impurity is ion-implanted in the PMOS region to form a p-type low-resistance region 65. For example, phosphorus (P$^+$) ions are ion-implanted in the NMOS region at an acceleration energy of about 8 keV and a dosage of about $1\times10^{16}$ cm$^{-2}$, and boron (B$^+$) ions are ion-implanted in the PMOS region at an acceleration energy of about 5 keV and a dosage of about $5\times10^{15}$ cm$^{-2}$. The extension regions and the low-resistance regions are combined to form source/drain regions. The impurities introduced by ion implantation are activated by two-stage annealing. Specifically, for example, first, RTA is performed at about 1,025° C. with a holding time of the maximum temperature of 0 to 3 seconds or millisecond annealing is performed at about 900° C., and RTA is then performed at about 1,025° C. with a holding time of the maximum temperature of 0 to 3 seconds.

As illustrated in FIG. 1T, a nickel (Ni) alloy layer having a thickness of, for example, about 20 nm is deposited on the silicon substrate 10 by sputtering. A silicide reaction is caused by, for example, annealing the substrate at about 270° C. for about 30 seconds to form a (di)silicide layer on the surface of silicon. An unreacted nickel alloy layer is removed by washing out with, for example, sulfuric acid and hydrogen peroxide. Furthermore, annealing is performed, for example, at about 400° C. for about 30 seconds to form a low-resistance silicide layer 66 made of nickel monosilicide.

After the formation of the silicide layer 66, a silicon nitride (SiN) film 67 having a thickness of about 50 nm is deposited on the silicon substrate 10 by CVD at about 400° C. and functions as both an etching stopper and a stress film. For example, a tensile-stress SiN film is deposited, and a resist pattern covering the NMOS region is then formed. The SiN film located on the PMOS region is removed by dry etching using the resist pattern as a mask. The resist pattern is then removed. The tensile-stress SiN film is left on the NMOS transistor to improve the mobility of electrons. Next, a compressive-stress SiN film is deposited, and a resist pattern covering the PMOS region is then formed. The SiN film located on the NMOS region is removed by dry etching using the resist pattern as a mask. The resist pattern is then removed. The compressive-stress SiN film is left on the PMOS transistor to improve the mobility of holes. Known methods may be employed to deposit these stress SiN films.

A silicon oxide film 68 having a thickness of about 600 nm and made of, for example, phosphosilicate glass (PSG) is deposited on the SiN film 67 by PE-CVD at about 400° C. The surface of the silicon oxide film 68 is planarized by CMP.

Contact holes penetrating the silicon oxide film 68 and the SiN film 67 are etched. For example, a titanium (Ti) film having a thickness of about 10 nm and an titanium nitride (TiN) film having a thickness of about 10 nm are deposited by sputtering. A tungsten (W) film having a thickness of about 300 nm is then deposited by CVD to fill the contact holes. An unnecessary metal film on the silicon oxide film 68 is removed by CMP to form tungsten (W) plugs 69.

As illustrated in FIG. 1U, a lower interlayer insulating film 71 made up of a silicon oxide film or a low-dielectric-constant insulating film is formed so as to cover the silicon oxide film 68 and the W plugs 69, and trenches for interconnecting lines are etched. For example, an electrically conductive copper-diffusion barrier (barrier metal) film made of, for example, titanium nitride (TiN), tantalum nitride (TaN), or tantalum (Ta) and a copper seed layer are deposited by sputtering. A copper layer is formed by plating to fill the trenches. An unnecessary metal layer on the lower interlayer insulating film 71 is removed by CMP to form a single-damascene lower copper interconnecting lines 72 that are embedded in the trenches and connected to the W plugs 69. An insulating copper diffusion-preventing film 74 made of silicon nitride (SiN) or silicon carbide (SiC) and an insulating film 75 made of, for example, a porous silica low-dielectric-constant insulating material are stacked on the lower interlayer insulating film 71 so as to cover the lower copper interconnecting lines 72 to form an interlayer insulating film. Trenches having a shape of interconnecting lines and via holes for exposing the lower copper interconnecting lines 72 are etched in the interlayer insulating film. An electrically conductive copper-diffusion barrier film and a copper seed layer are deposited by sputtering. A copper layer is formed by plating to fill the trenches and the via holes. An unnecessary metal layer on the interlayer insulating film is removed by CMP to form dual-damascene copper interconnecting lines 76. The steps of forming the interlayer insulating film and forming the copper interconnecting lines are repeated desired times to form a multilayer interconnection. Aluminum (Al) pads are formed on the top layer according to need. A known process may be employed as the process of forming the interconnecting lines.

FIGS. 2A to 2D are cross-sectional views illustrating the relevant part of a method for manufacturing a semiconductor device according to the embodiment described above, the relevant part being extracted from the standpoint of annealing of cap layers provided on high-dielectric-constant insulating films.

Figure 2A:
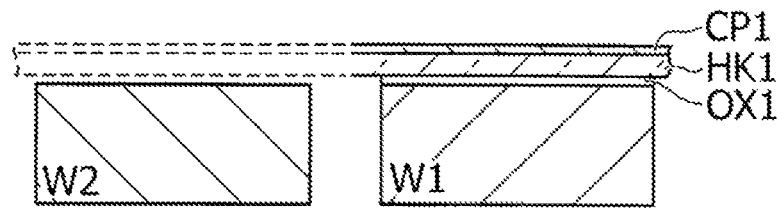
FIGS. 2A to 2D are cross-sectional views illustrating the relevant part of a method for manufacturing a semiconductor device according to an embodiment, the relevant part being extracted from the standpoint of annealing of cap layers provided on high-dielectric-constant insulating films.

As illustrated in FIG. 2A, a first well W1 of a first conductivity type (hereinafter also referred to as "first-conductivity-type well W1") and a second well W2 of a second conductivity type (hereinafter also referred to as "second-conductivity-type well W2") are formed on a silicon substrate. A first silicon oxide film OX1 is formed on the surface of the wells, a first high-dielectric-constant insulating film HK1 is formed on the first silicon oxide film OX1, and a first cap dielectric film CP1 is formed on the first high-dielectric-constant insulating film HK1. In this step, the thickness of the first high-dielectric-constant insulating film HK1 is set so as to be smaller than the thickness of a desired high-dielectric-constant insulating film. The first cap dielectric film CP1 located above the second well W2 is removed, and furthermore, the first high-dielectric-constant insulating film HK1 and the first silicon oxide film OX1 are also similarly removed. Note that the first high-dielectric-constant insulating film HK1 and the first silicon oxide film OX1 may be left.

Figure 2B:
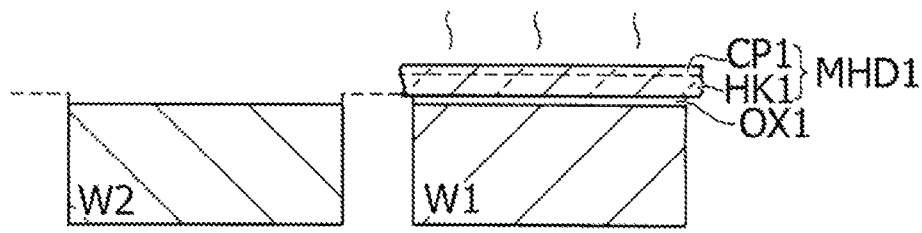

As illustrated in FIG. 2B, a first annealing for causing at least one element included in the first cap dielectric film CP1 to diffuse into the first high-dielectric-constant insulating film HK1 is conducted. The first annealing is conducted so that at least one element included in the first cap dielectric film CP1 diffuses to the interface between the first high-dielectric-constant insulating film HK1 and the first silicon oxide film OX1. The first annealing is conducted at a sufficiently high temperature for a sufficient time. Consequently, the first high-dielectric-constant insulating film HK1 and the first cap dielectric film CP1 are fused to each other to lose the interface, thus forming a single modified high-dielectric-constant insulating film MHD1.

Figure 2C:
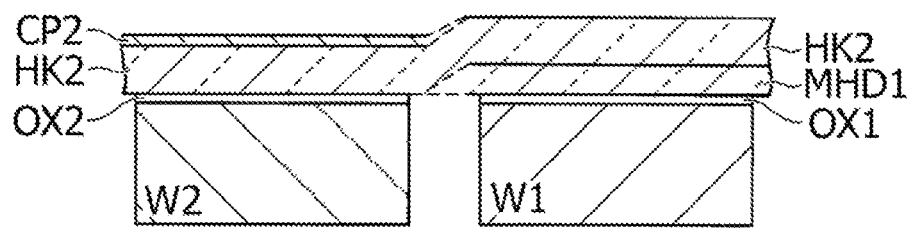

As illustrated in FIG. 2C, a second silicon oxide film OX2 is formed on the surface of the second-conductivity-type well W2, a second high-dielectric-constant insulating film HK2 is formed on the second silicon oxide film OX2, and a second cap dielectric film CP2 is formed on the second high-dielectric-constant insulating film HK2. In this step, the second high-dielectric-constant insulating film HK2 is also deposited on the modified high-dielectric-constant insulating film MHD1 disposed above the first-conductivity-type well W1. The second cap dielectric film CP2 is removed from above the first-conductivity-type well W1.

Figure 2D:
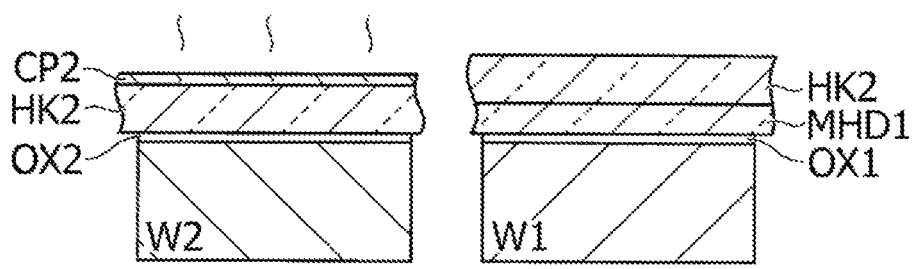

As illustrated in FIG. 2D, a second annealing for causing at least one element included in the second cap dielectric film CP2 to diffuse into the second high-dielectric-constant insulating film HK2 is conducted. The second annealing is conducted at a temperature lower than that in the first annealing. Thus, the conditions for the second annealing are set so that excessive diffusion or the like does not occur.

A gate insulating film on the first well W1 includes a laminate having the first silicon oxide film OX1, the modified high-dielectric-constant insulating film MHD1, and the second high-dielectric-constant insulating film HK2. A gate insulating film on the second well W2 includes a laminate having the second silicon oxide film OX2, the second high-dielectric-constant insulating film HK2, and the second cap dielectric film CP2.

By dividing the desired thickness of the high-dielectric-constant insulating film into two, the thickness of the first high-dielectric-constant insulating film may be controlled to be small. The conditions for the process of diffusion to the high-dielectric-constant insulating film having the small thickness may be relaxed.

According to the method illustrated in FIGS. 2A to 2D, the high-dielectric-constant insulating film provided on the second-conductivity-type well W2 is only the second high-dielectric-constant insulating film HK2, and the high-dielectric-constant insulating film provided on the first-conductivity-type well W1 is the combination of the first high-dielectric-constant insulating film HK1 and the second high-dielectric-constant insulating film HK2. At any time, the thickness of the high-dielectric-constant insulating film of one MOS transistor may be smaller than the thickness of the high-dielectric-constant insulating film of the other MOS transistor by a thickness corresponding to the first high-dielectric-constant insulating film HK1. This relationship is not limited thereto.

Figure 3:
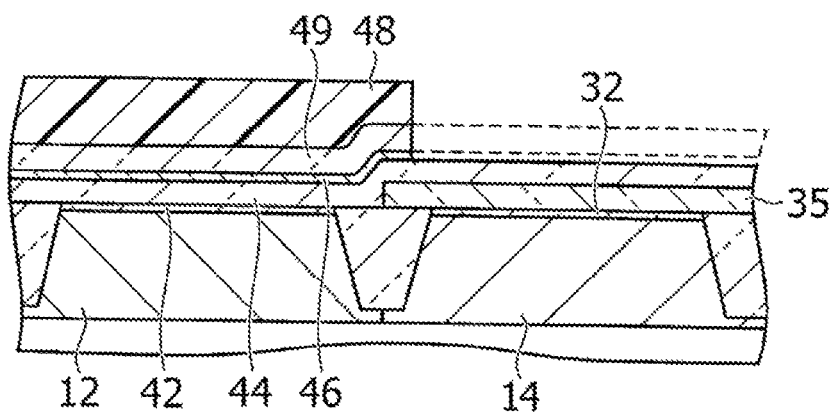
FIG. 3 is a cross-sectional view illustrating a modification in which a range of selection of the thickness of a high-dielectric-constant insulating film of one metal oxide semiconductor (MOS) transistor may be extended relative to the thickness of a high-dielectric-constant insulating film of another MOS transistor.

FIG. 3 illustrates a modification in which the relationship between the thickness of a high-dielectric-constant insulating film of one MOS transistor and the thickness of a high-dielectric-constant insulating film of another MOS transistor may be selected from a wide range. A manufacturing process is conducted as in the embodiment described above until the following steps are completed. Specifically, in the step illustrated in FIG. 1G, the first HfO film 34 and the AlO film 36 are patterned and left on the PMOS transistor region. Subsequently, in the step illustrated in FIG. 1H, annealing for causing aluminum to diffuse is conducted to form the Al-diffused HfO film 35.

As illustrated in FIG. 3, after the HfO film 35 is formed, the second HfO film 44 and the LaO film 46 are formed, and a third HfO film 49 is further formed on the LaO film 46. A resist pattern 48 covering the NMOS transistor region is formed on the third HfO film 49. The third HfO film 49 and the LaO film 46 are removed by etching. The step illustrated in FIG. 1M and the subsequent steps are then performed. However, a structure in which the third HfO film 49 is formed on the LaO film 46, as illustrated in FIG. 3, is obtained.

When the insulating film is nitrided, plasma nitriding (supply of nitrogen into the film) is performed, and annealing is then conducted in a nitrogen atmosphere. Nitrogen supplied to the insulating film by the plasma nitriding is fixed in the insulating film by the annealing. This nitriding of the insulating film is used as a parameter to control diffusion. When the nitriding is strongly performed, diffusion of an element is suppressed. From the standpoint of suppressing diffusion, the same effect as decreasing the annealing temperature is obtained. From another standpoint, the temperature of annealing performed after the plasma nitriding may be increased. A second embodiment will be described below. For example, a first high-dielectric-constant insulating film 34 is a HfO film, a first cap dielectric film 36 is an AlO film, a second high-dielectric-constant insulating film 44 is a HfSiO film, and a second cap dielectric film 46 is a LaO film.

Figure 4A:
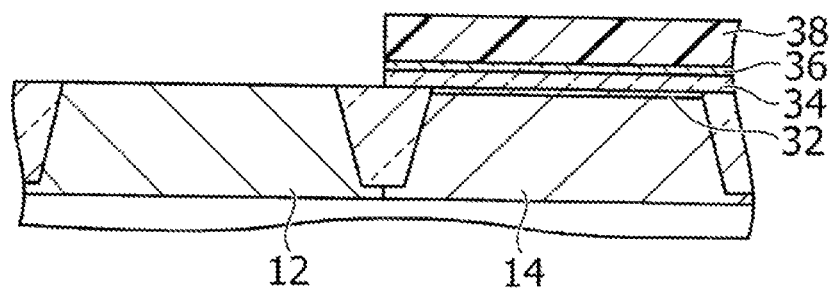
FIGS. 4A to 4E are cross-sectional views illustrating main steps of a method for manufacturing a semiconductor device according to a second embodiment and a modification.

As illustrated in FIG. 4A, the steps illustrated in FIGS. 1A to 1G are performed as in the first embodiment. Specifically, an insulating laminate including a silicon oxide film 32, a HfO film 34, and an AlO film 36 is formed on a silicon substrate. A resist pattern 38 covering a PMOS region is formed thereon, and the insulating laminate located on an NMOS region is removed. The resist pattern 38 is then removed.

Figure 4B:
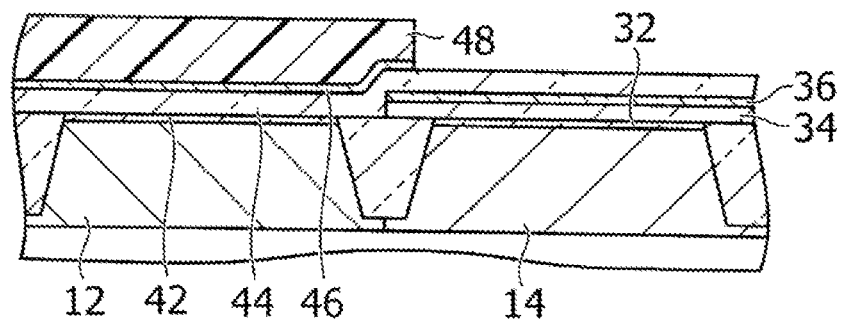

As illustrated in FIG. 4B, a silicon oxide film 42 is formed in the NMOS region by thermal oxidation. Subsequently, the HfSiO film 44 and the LaO film 46 are deposited on the silicon substrate so as to cover the insulating laminate provided on the PMOS region. Next, a resist pattern 48 covering the NMOS region is formed, and the LaO film 46 in the PMOS region is removed by etching. This structure corresponds to the structure illustrated in FIG. 1K, but the annealing illustrated in FIG. 1H is not conducted. In FIG. 1K, the HfO film 34 and the AlO film 36 are fused to each other, and thus the HfO film 35 including aluminum (Al) may be formed. In contrast, in FIG. 4B, the HfO film 34 and the AlO film 36 are stacked two layers. The resist pattern 48 is then removed.

In the PMOS region, the AlO film 36 is sandwiched between the first high-dielectric-constant insulating film 34 and the second high-dielectric-constant insulating film 44, and is covered with the second high-dielectric-constant insulating film 44. In the NMOS region, the LaO film 46 is formed on the second high-dielectric-constant insulating film 44 and is exposed to the upper space. Plasma nitriding and annealing are conducted in this state.

Figure 4C:
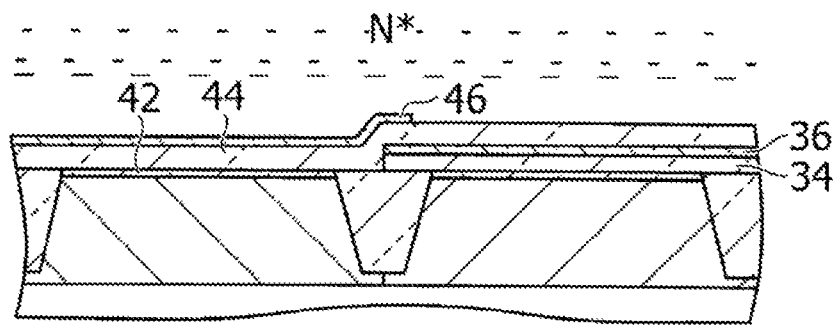

As illustrated in FIG. 4C, a plasma nitriding treatment on the surface of the insulating laminate is conduced. A plasma including nitrogen, such as nitrogen plasma or ammonia plasma, is formed in a space above the silicon substrate. For example, the electric power is selected from the range of 50 to 2,000 W, and the gas pressure is selected from the range of 1 m Torr to 1 Torr. In this step, since the LaO film 46 in the NMOS region is exposed, nitrogen is introduced into the LaO film 46. In contrast, since the AlO film 36 in the PMOS region is masked with the HfSiO film 44, nitrogen is hardly introduced into the AlO film 36.

Figure 4D:
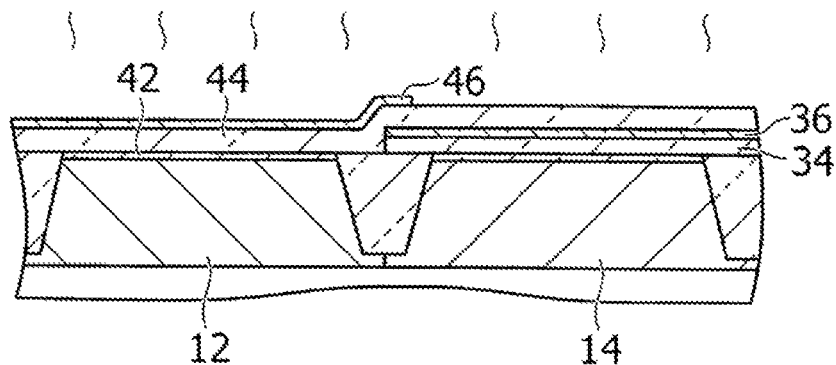

As illustrated in FIG. 4D, annealing is conduced. For example, a heat treatment is conducted in a nitriding gas atmosphere at a temperature in the range of 750° C. to 1,100° C. for about five seconds to fix nitrogen in the film. For example, the heat treatment is conducted at about 1,050° C. for about five seconds. In this case, in the NMOS region, diffusion of lanthanum (La) is suppressed by the mixing of nitrogen in the LaO film. On the other hand, in the PMOS region, nitrogen is hardly introduced into the AlO film 36 and the HfO film 34 which is the first high-dielectric-constant insulating film and which is disposed under the AlO film 36. Accordingly, aluminum may be caused to sufficiently diffuse from the AlO film 36 into the HfO film 34. In the above embodiment, the insulating laminate is formed in the PMOS region and the NMOS region without conducting annealing for diffusion.

Figure 4E:
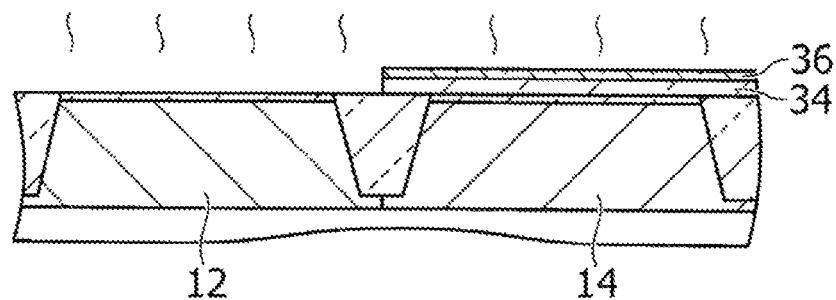

As illustrated in FIG. 4E, after the step illustrated in FIG. 4A, a first annealing may be conducted in a state in which the insulating laminate is formed on one of the CMOS regions, for example, on the PMOS region to finely adjust the threshold (Vth). This annealing is preliminary annealing before main annealing, and thus is conducted under mild conditions.

Modifications of the first embodiment, for example, the use of a hard mask may be appropriately adopted in the second embodiment.

The invention has been described in accordance with embodiments, but the invention is not limited thereto. For example, the materials of the high-dielectric-constant insulating films and the cap dielectric films are not limited to the materials described in the embodiments. Parameters such as the thickness and the temperature are also not limited to those described in the embodiments. All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention.

Although the embodiment(s) of the present inventions have been described in detail, it should be understood that various changes, substitutions, and alterations could be made hereto without departing from the spirit and scope of the invention.

What is claimed is:

1. A method for manufacturing a semiconductor device comprising:

forming a first-conductivity-type well of a first conductivity type and a second-conductivity-type well of a conductivity type opposite to the first conductivity type in a silicon substrate;

stacking a first high-dielectric-constant insulating film above the silicon substrate;

stacking a first cap dielectric film above the first high-dielectric-constant insulating film;

removing the first cap dielectric film and first high-dielectric-constant insulating film above the second-conductivity-type well stacking a second high-dielectric-constant insulating film and a second cap dielectric film above the silicon substrate so as to cover the first high-dielectric-constant insulating film and first cap dielectric film;

removing the second cap dielectric film disposed above the first-conductivity-type well; and after removing the second cap dielectric film disposed above the first-conductive-type well, conducting a heat treatment in a nitriding gas atmosphere to fix nitrogen in the second cap dielectric film above the second-conductivity-type well, and to cause an element included in the first cap dielectric film to diffuse into the first high-dielectric-constant insulating film disposed above the first-conductivity-type well.

2. The method according to claim 1, further comprising:

prior to stacking the second high-dielectric-constant insulating film and the second cap dielectric film, conducting a first annealing at a first temperature to cause an element included in the first cap dielectric film to diffuse into the first high-dielectric-constant insulating film disposed above the first-conductivity-type well.

\* \* \* \* \*